(12) United States Patent
Lin et al.

(10) Patent No.: US 12,133,337 B2
(45) Date of Patent: Oct. 29, 2024

(54) CIRCUIT STRUCTURE AND FABRICATION METHOD THEREOF

(71) Applicant: Innolux Corporation, Miao-Li County (TW)

(72) Inventors: Yi Hung Lin, Miao-Li County (TW); Li-Wei Sung, Miao-Li County (TW)

(73) Assignee: Innolux Corporation, Miaoli County (TW)

(*) Notice: Subject to any disclaimer, the term of this patent is extended or adjusted under 35 U.S.C. 154(b) by 271 days.

(21) Appl. No.: 17/096,968

(22) Filed: Nov. 13, 2020

(65) Prior Publication Data
US 2021/0400819 A1    Dec. 23, 2021

(30) Foreign Application Priority Data

Jun. 23, 2020 (CN) .......................... 202010578387.4

(51) Int. Cl.
*H05K 1/02* (2006.01)
*H05K 1/11* (2006.01)
*H05K 1/18* (2006.01)
*H05K 3/00* (2006.01)
*H05K 3/34* (2006.01)

(52) U.S. Cl.
CPC ......... *H05K 3/3436* (2013.01); *H05K 1/0268* (2013.01); *H05K 1/113* (2013.01); *H05K 1/186* (2013.01); *H05K 3/0017* (2013.01)

(58) Field of Classification Search
CPC .............. H05K 1/0268; H05K 1/113; H05K 2203/162; H05K 3/4007; H05K 3/007; H05K 3/4682; G01R 31/2812; G01R 31/2818
See application file for complete search history.

(56) References Cited

U.S. PATENT DOCUMENTS

2015/0009645 A1* 1/2015 Kaneko ............... H05K 3/4007
                                                     361/767
2019/0335594 A1* 10/2019 Matsuura ........... H05K 3/4682

FOREIGN PATENT DOCUMENTS

| CN | 101950745 | 1/2011 |
| CN | 103151329 | 7/2016 |
| CN | 108269745 | 7/2018 |

OTHER PUBLICATIONS

"Office Action of China Counterpart Application", issued on Jan. 11, 2024, p. 1-p. 10.
"Office Action of China Counterpart Application", issued on May 28, 2024, p. 1-p. 9.

* cited by examiner

*Primary Examiner* — Livius R. Cazan
(74) *Attorney, Agent, or Firm* — JCIPRNET

(57) ABSTRACT

A circuit structure and a fabrication method thereof are provided. The fabrication method of the circuit structure includes the following steps: providing a substrate; fabricating a test circuit component on the substrate; fabricating a solder pad on the test circuit component; fabricating an insulating layer; and fabricating a conductive pad on the insulating layer. A second surface of the insulating layer covers the test circuit component and the solder pad. The conductive pad is coupled to the solder pad. Through the fabrication method of the circuit structure provided by the disclosure, circuit quality of the circuit structure may be monitored, and that reliability of the circuit structure provided by the disclosure is improved.

13 Claims, 5 Drawing Sheets

CIRCUIT STRUCTURE AND FABRICATION METHOD THEREOF

CROSS-REFERENCE TO RELATED APPLICATION

This application claims the priority benefit of China application serial no. 202010578387.4, filed on Jun. 23, 2020. The entirety of the above-mentioned patent application is hereby incorporated by reference herein and made a part of this specification.

BACKGROUND

Technical Field

The disclosure relates to a circuit structure and a fabrication method thereof, and in particular, to a circuit structure and a fabrication thereof through which reliability may be improved.

Description of Related Art

With the vigorous development of electronic products, fabrication methods (e.g., testing technology, processing technology, and the like) of electronic products are constantly improved. Therefore, how to increase the output or reduce the costs of electronic devices is an important issue.

SUMMARY

The disclosure provides a fabrication method of a circuit structure through which circuit quality of the circuit structure may be monitored or reliability may be improved.

The disclosure further provides a circuit structure through which reliability may be improved.

According to an embodiment of the disclosure, a fabrication method of a circuit structure includes the following steps. First, a substrate is provided. Next, a test circuit component is fabricated on the substrate. Then, a solder pad is fabricated on the test circuit component. Afterward, an insulating layer is fabricated. A second surface of the insulating layer covers the test circuit component and the solder pad. Next, a conductive pad is fabricated on the insulating layer. The conductive pad is coupled to the solder pad.

According to an embodiment of the disclosure, the circuit structure includes the insulating layer, the conductive pad, and the solder pad. The insulating layer has a first surface and a second surface opposite to the first surface. The conductive pad is disposed on the first surface of the insulating layer. The solder pad is disposed on the second surface of the insulating layer. The solder pad is coupled to the conductive pad. The insulating layer has a recess region on the second surface.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
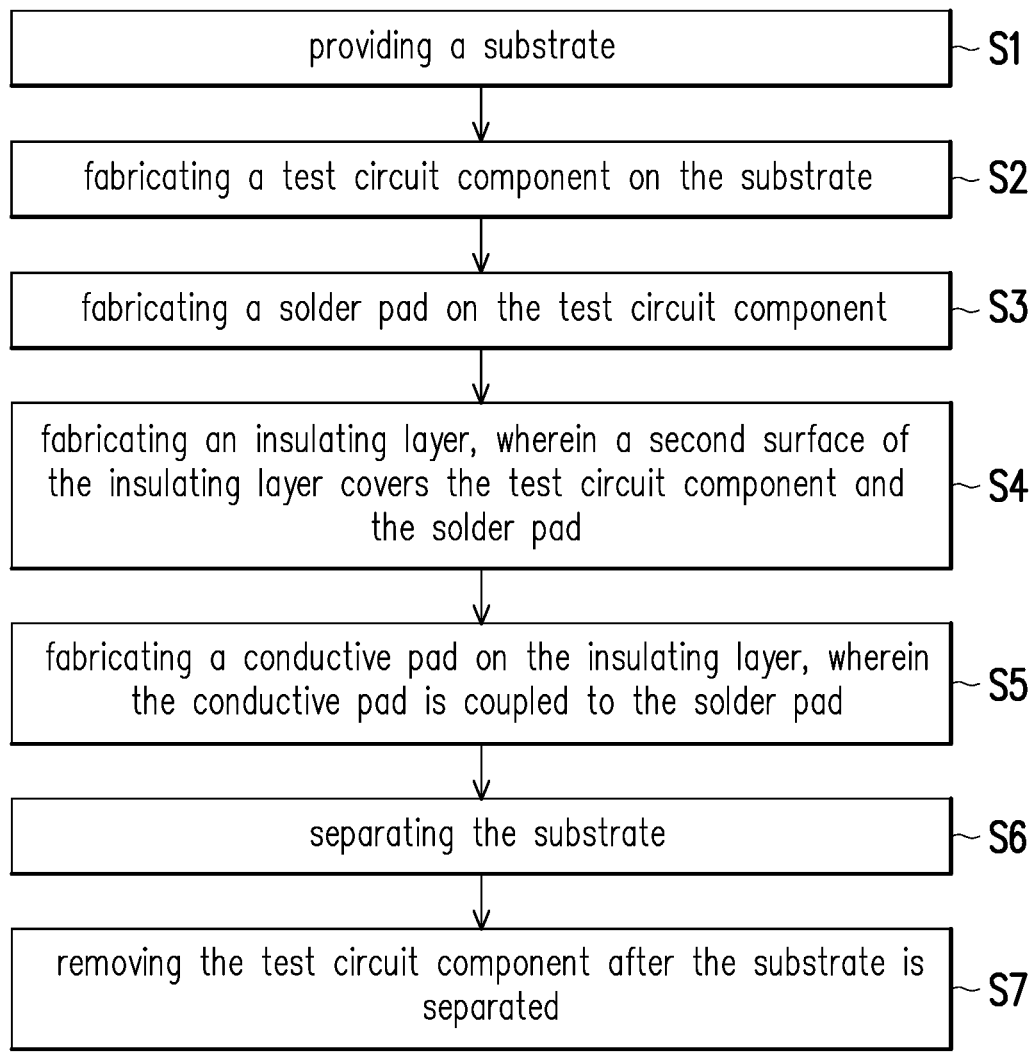
FIG. 1 is a flow chart of a fabrication method of a circuit structure according to an embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device is depicted in the accompanying drawings of the disclosure, and specific components in the drawings are not depicted according to actual scales. In addition, the numbers and sizes of the components in each drawing are provided for illustration only and are not used to limit the scope of the disclosure.

Unless otherwise defined, all terms (including technical and scientific terms) used herein have the same meaning as commonly understood by a person of ordinary skill in the art. It will be further understood these terms, such as those defined in commonly used dictionaries, should be interpreted as having meaning that is consistent with their meaning in the context of the related art and the disclosure and should not be interpreted in an idealized or overly formal sense unless expressly so defined herein.

In the following specification and claims, the words "containing" and "including" are open-ended words and therefore should be interpreted as "containing but not limited to . . . ".

It should be understood that when a component or a film layer is referred to as being "on" or "connected to" another component or film layer, it can be directly on the another component or film layer or be directly connected to the another component or film layer, or an inserted component or film layer may be provided therebetween (not a direct connection). In contrast, when the component is referred to as being "directly on" another component or film layer or "directly connected to" another component or film layer, an inserted component or film layer is not provided therebetween.

The ordinal numbers used in the specification and claims, such as "first", "second", etc., are used to modify the components, and they do not imply or represent the (or these) components have any previous ordinal numbers, do not represent the order of a component and another component, or the order of a manufacturing method. The use of these ordinal numbers is only used to clearly distinguish a component with a certain name from another component with the same name. The terms used in the claims and the specification may not have to be the same, and accordingly, the first component provided in the specification may be the second component in the claims.

The terms "about", "equal to", "identical" or "same", "substantially", or "approximately" are generally interpreted as being within 20% of a given value or range or are interpreted as being within 10%, 5%, 3%, 2%, 1%, or 0.5% of a given value or range.

In the disclosure, the thickness, length, and width may be measured by an optical microscope, and the thickness may be measured from a cross-sectional image in a scanning electron microscope, but it is not limited thereto. In addition, a certain error may be provided between any two values or directions used for comparison. If the first value is equal to the second value, it implies that an error of approximately 10% is provided between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

In some embodiments of the disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for joining and connecting may also include the case where both structures are movable or both structures are fixed. In addition, the word "coupled" may include any direct or indirect electrical connection means.

It should be understood that in the following embodiments, the features of several different embodiments may be replaced, recombined, and mixed to complete other embodiments without departing from the spirit of the disclosure. As long as the features of the embodiments do not violate or do not conflict with the spirit of the disclosure, they may be mixed and matched arbitrarily.

The electronic device provided by the disclosure may include but not limited to a display device, an antenna device (such as a liquid crystal antenna), a sensing device, a light emitting device, a touch device, or a tiling device. The electronic device may include a bendable and flexible electronic device. The appearance of the electronic device may be rectangular, circular, polygonal, or a shape with curved edges, or other suitable shapes. The electronic device may include but not limited to a light emitting diode, liquid crystal, fluorescence, phosphor, or quantum dot (QD) material, other suitable materials, or a combination of the foregoing, for example. The light emitting diode may include but not limited to an organic light emitting diode (OLED), an inorganic light-emitting diode (LED), a mini LED, a micro LED, or a QD LED (e.g., QLED and QDLED), other suitable materials, or a combination of the foregoing, for example. Note that the electronic device may be but not limited to be any combination of the foregoing.

A circuit structure provided by the disclosure may include but not limited to a redistribution layer (RDL).

Descriptions of the disclosure are given with reference to the exemplary embodiments illustrated by the accompanying drawings. Wherever possible, the same reference numbers are used in the drawings and the description to refer to the same or like parts.

Figure 3:
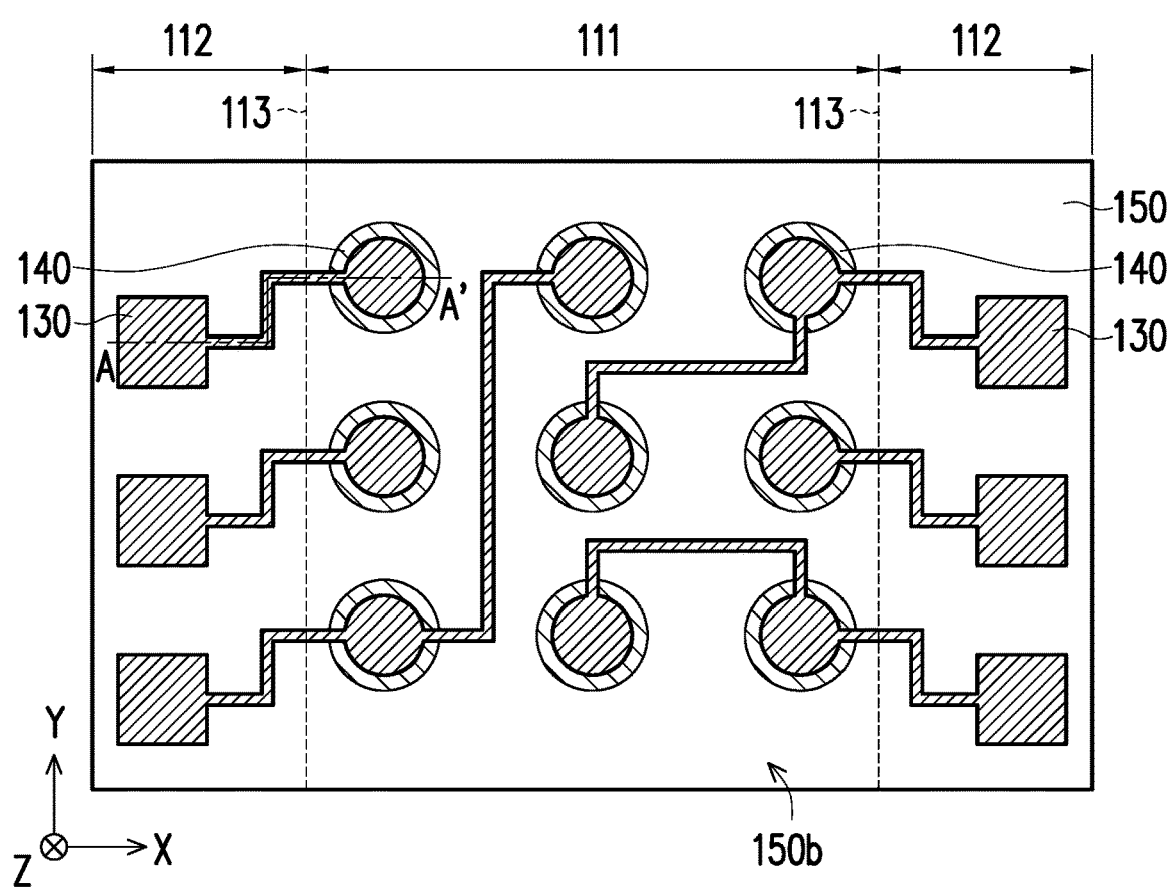
FIG. 3 is a bottom schematic view of the circuit structure of FIG. 2B.
Figure 4:
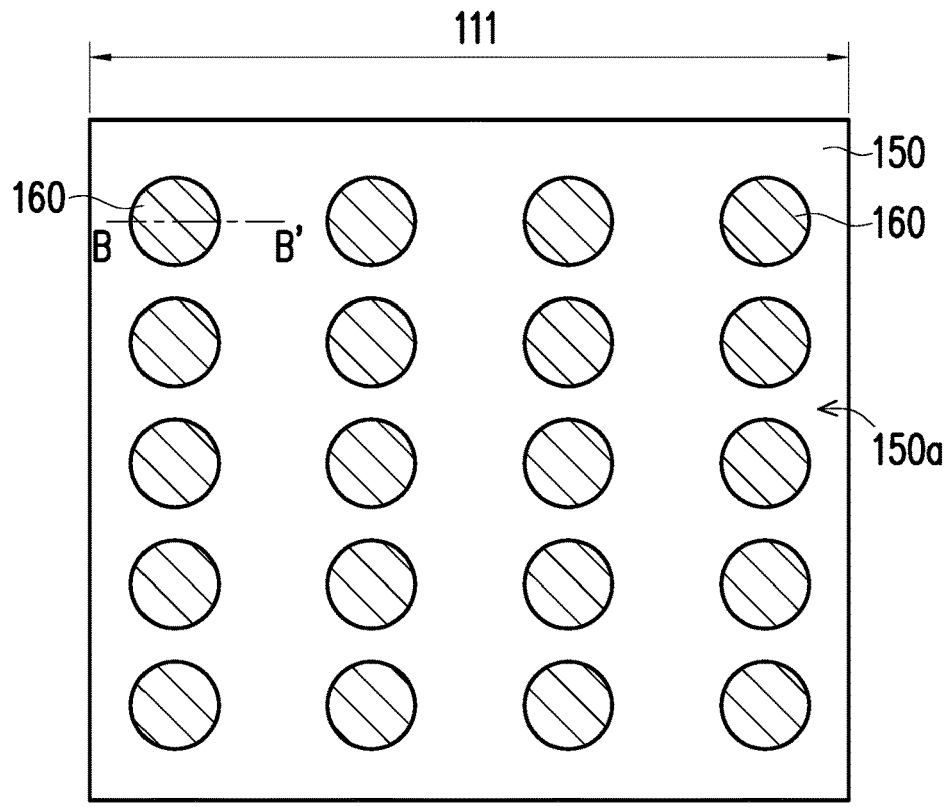
FIG. 4 is a top schematic view of the circuit structure of FIG. 2D.

FIG. 1 is a flow chart of a fabrication method of a circuit structure according to an embodiment of the disclosure. FIG. 2A to FIG. 2E are cross-sectional schematic views of the fabrication method of the circuit structure according to an embodiment of the disclosure. FIG. 3 is a bottom (viewing from below) schematic view of the circuit structure of FIG. 2B. FIG. 4 is a top (viewing from above) schematic view of the circuit structure of FIG. 2D. Herein, FIG. 2B may be a cross-sectional schematic view of the circuit structure of FIG. 3 taken along a cross-sectional line A-A', and FIG. 2D may be a cross-sectional schematic view of the circuit structure of FIG. 4 taken along a cross-sectional line B-B'. Besides, for clarity of the accompanying drawings and convenience of description, several components in the circuit structure are omitted in FIG. 3 and FIG. 4.

Figure 2A:
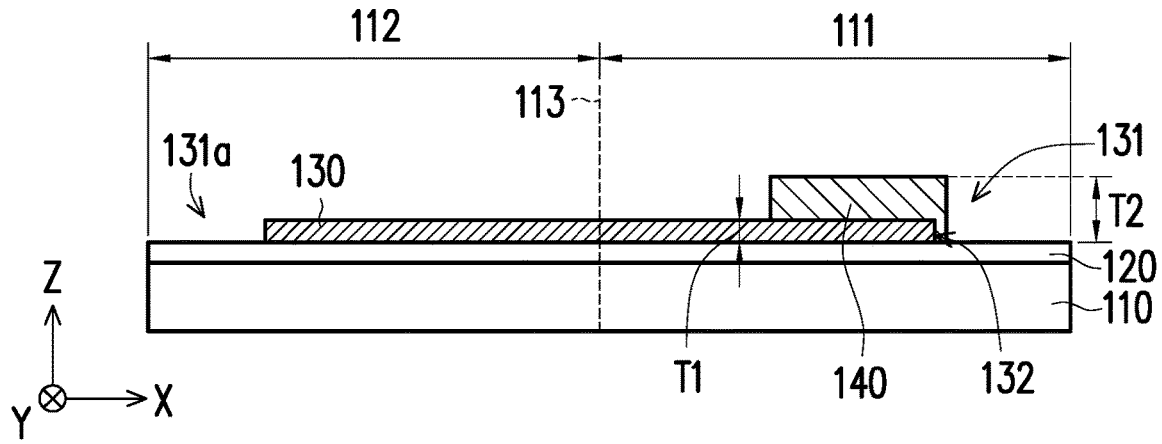
FIG. 2A to FIG. 2E are cross-sectional schematic views of the fabrication method of the circuit structure according to an embodiment of the disclosure.

First, with reference to FIG. 1 and FIG. 2A together, in a fabrication method of a circuit structure 100 provided by the present embodiment, step S1, step S2, and step S3 are performed first. In step S1, a substrate 110 is provided. The substrate 110 includes a main region 111, a peripheral region 112, and a cutting line 113. The cutting line 113 is located at the junction between the main region 111 and the peripheral region 112. The peripheral region 112 may be removed in the following cutting step, and the main region 111 is kept in the following cutting step. In this embodiment, the substrate 110 may include a rigid substrate or a flexible substrate. For instance, when the substrate 110 is a rigid substrate, a material thereof may include but not limited to glass, quartz, sapphire, ceramic, other suitable substrate materials, or a combination of the foregoing. When the substrate 110 is a flexible substrate, the material thereof may include but not limited to polyimide (PI), polyethylene terephthalate (PET), other suitable substrate materials, or a combination of the foregoing.

Next, in this embodiment, a release layer 120 may be but not limited to be selectively formed on the substrate 110. That is, in other embodiments, the release layer 120 may selectively not to be disposed. In this embodiment, the release layer 120 and the substrate 110 may both be separated in the following steps. The release layer 120 may be but not limited to be formed of a polymer-based material, for example. For instance, in some embodiments, the release layer 120 may be an epoxy resin-based heat release material which may lose its adhesive property when being heated, such as a light-to-heat-conversion (LTHC) release coating layer. In other embodiments, the release layer 120 may also be ultra-violet (UV) glue which may lose its adhesive property when being exposed to UV light.

In step S2, a test circuit component 130 is fabricated on the substrate 110, so as to configure the test circuit component 130 and the substrate 110 to be located on two opposite sides of the release layer 120. In this embodiment, the test circuit component 130 does not completely cover the release layer 120. The test circuit component 130 has a plurality of openings 131 and 131a, and the openings 131 and 131a expose part of the release layer 120. To be specific, in this embodiment, the test circuit component 130 is fabricated through but not limited to the following steps, for example. A seed layer (not shown), for example, is formed on the release layer 120 first through methods such as physical vapor deposition (PVD), so as to configure the seed layer to be disposed in the main region 111 and the peripheral region 112 of the substrate 110. Next, part of the seed layer is removed through etching, for example, and the remaining seed layer forms the test circuit component 130. The test circuit component 130 is configured to be disposed in the main region 111 and the peripheral region 112 of the substrate 110, and the test circuit component 130 is configured to extend from the main region 111 to the peripheral region 112 of the substrate 110. In this embodiment, the seed layer may be made of a conductive material, and the conductive material may be a single layer or a composite layer including multiple layers formed of different conductive materials. The material of the seed layer includes but not limited to, titanium, copper, aluminum, molybdenum, silver, other suitable materials, or a combination of the foregoing, for example. In some embodiments, the seed layer may include a titanium layer and a copper layer located on the titanium layer. In the present embodiment, the test circuit component 130 may be made of a conductive material, such as metal or metal alloy. The material of the test circuit component 130 includes but not limited to, titanium, copper, aluminum, molybdenum, silver, other suitable materials, or a combination of the foregoing, for example.

In step S3, a solder pad 140 is fabricated on the test circuit component 130, and the solder pad 140 is configured to be coupled to the test circuit component 130. With reference to FIG. 2A, the solder pad 140 may extend beyond the test circuit component 130 and contact the release layer 120. In other embodiments, the solder pad 140 may contact the test circuit component 130 and does not contact the release layer 120. In other embodiments, the solder pad 140 may be smaller than the test circuit component 130, which should however not be construed as limitations to the disclosure. To be specific, in this embodiment, the solder pad 140 is fabricated through but not limited to the following steps, for example. A patterned photoresist (not shown) is formed first on the test circuit component 130 and the release layer 120 exposed by the test circuit component 130. Herein, the patterned photoresist has a plurality of openings (not shown), and the openings expose portions of the test circuit component 130 and/or portions of the release layer 120. Next, a plating process (such as but not limited to electroplating) is adopted to form the solder pad 140 in the openings of the patterned photoresist. Afterward, the patterned photoresist is removed, and other portions of the test circuit component 130 and/or other portions of the release layer 120 are exposed. Fabrication of the solder pad 140 is completed so far. In the present embodiment, the solder pad 140 may be metal or metal alloy. The material of the solder pad 140 includes but not limited to titanium, copper, aluminum, molybdenum, silver, other suitable materials, or a combination of the foregoing, for example. In this embodiment, the solder pad 140 and the test circuit component 130 may selectively be made of the same material but may also be selectively made of different materials, which is not limited by the disclosure.

To be specific, in this embodiment, the solder pad 140 is disposed on the test circuit component 130 in the main region 111 of the substrate 110. The solder pad 140 is disposed on a surface of the test circuit component 130 away from the substrate 110 to cover a portion of the test circuit component 130 and/or a lateral side 132 of such portion of the test circuit component 130 in the main region 111. The solder pad 140 may be coupled to the test circuit component 130. Besides, in this embodiment, a direction Z may be, for example, a thickness direction of the test circuit component 130, and a direction X, a direction Y, and the direction Z are different directions. For instance, the direction X and the direction Y are perpendicular to the direction Z, and the direction X is perpendicular to the direction Y. Besides, in the direction Z, a thickness T1 of the test circuit component 130 may be but not limited to be less than a thickness T2 of the solder pad 140. With reference to FIG. 3, in the direction Z, the solder pad 140 and the test circuit component 130 do not completely overlap, which should however not be construed as limitations to the disclosure. In other embodiments, the solder pad 140 may also be disposed in the peripheral region 112 of the substrate 110 (not shown). The thickness T1 of the test circuit component 130 and the thickness T2 of the solder pad 140 are both maximum thicknesses in the direction Z.

Figure 2B:
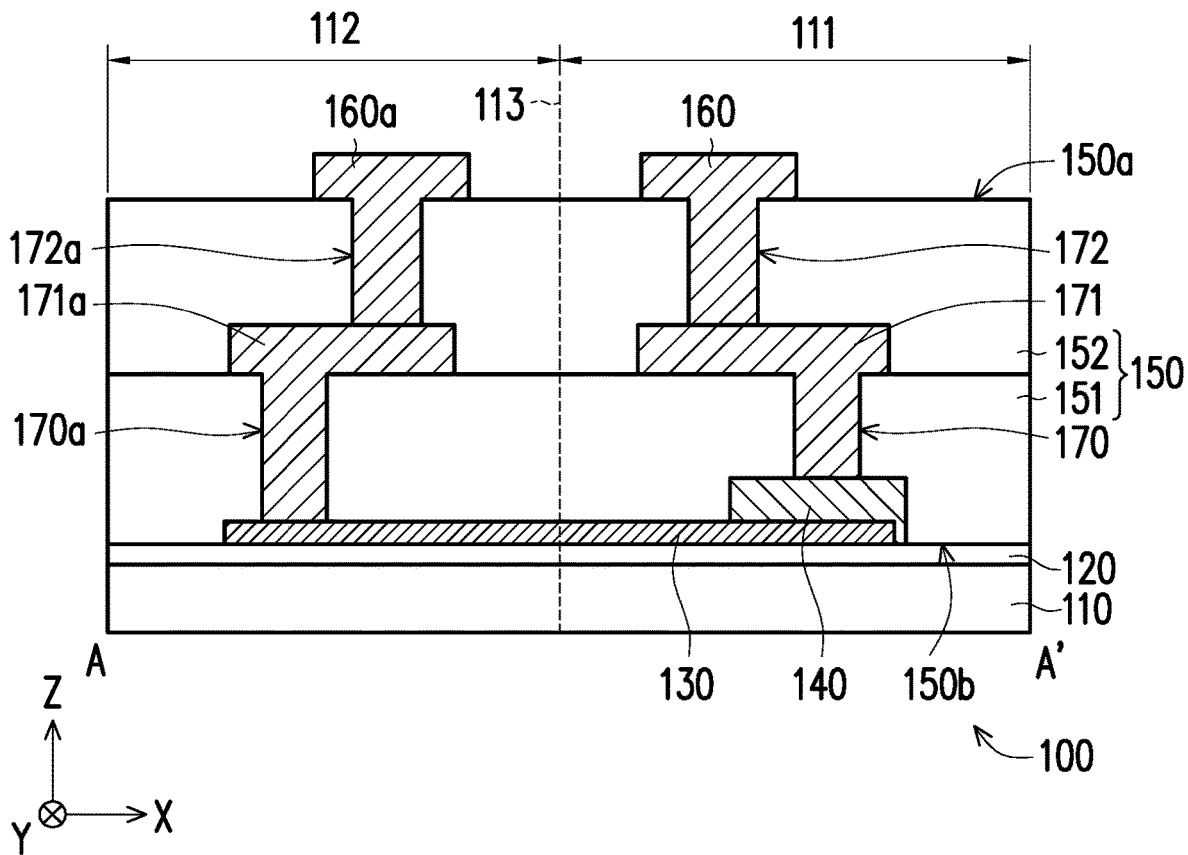

Next, with reference to FIG. 1, FIG. 2B, and FIG. 3 together, step S4 and step S5 are performed. In step S4, an insulating layer 150 is fabricated, and the insulating layer 150 covers the test circuit component 130 and the solder pad 140. In step S5, a conductive pad 160 is fabricated on the insulating layer 150. In the present embodiment, the insulating layer 150 may include a first insulating layer 151 and a second insulating layer 152 disposed on the first insulating layer 151, but the number of layers of the insulating layer 150 is not particularly limited in the disclosure. That is, in some embodiments, the number of layers of the insulating layer 150 may be one layer or may be two layers or more. In this embodiment, the insulating layer 150 has a first surface 150a and a second surface 150b opposite to the first surface 150a. The first surface 150a of the insulating layer 150 may be a surface of the insulating layer 150 away from the substrate 110, and the second surface 150b of the insulating layer 150 may be a surface of the insulating layer 150 adjacent to the substrate 110. Besides, in the direction Z, a maximum thickness of the insulating layer 150 may be but not limited to be greater than or equal to 30 μm and may be less than or equal to 40 μm.

To be specific, in this embodiment, the insulating layer 150 and the conductive pad 160 are fabricated through but not limited to the following steps, for example. The first insulating layer 151 is formed in the main region 111 and the peripheral region 112 of the substrate 110 first, so as to configure the first insulating layer 151 to cover the test circuit component 130, the solder pad 140, and the release layer 120 not covered by the test circuit component 130 and the solder pad 140. Next, a first via 170 is formed in the first insulating layer 151 located in the main region 111, and a first via 170a is formed in the first insulating layer 151 located in the peripheral region 112. The first via 170 may expose the solder pad 140, and the first via 170a may expose the test circuit component 130 located in the peripheral region 112. Next, a connection pad 171 is formed on the first insulating layer 151 located in the main region 111 and extends into the first via 170, and a connection pad 171a is formed on the first insulating layer 151 located in the peripheral region 112 and extends into the first via 170a. The connection pad 171 may be coupled to the solder pad 140 located in the main region 111, and the connection pad 171a may be coupled to the test circuit component 130 located in the peripheral region 112. Next, a second insulating layer 152 is formed in the main region 111 and the peripheral region 112 of the substrate 110, so as to configure the second insulating layer 152 to cover the connection pad 171, the connection pad 171a, and part of the first insulating layer 151. Next, a second via 172 is formed in the second insulating layer 152 located in the main region 111, and a second via 172a is formed in the second insulating layer 152 located in the peripheral region 112. The second via 172 may expose the connection pad 171 located in the main region 111, and the second via 172a may expose the connection pad 171a located in the peripheral region 112. Afterward, the conductive pad 160 is formed on the second insulating layer 152 located in the main region 111 and extends into the second via 172, and a test pad 160a is formed on the second insulating layer 152 located in the peripheral region 112 and extends into the second via 172a. The conductive pad 160 may be coupled to the connection pad 171 located in the main region 111, and the test pad 160a may be coupled to the connection pad 171a located in the peripheral region 112. In this embodiment, a material of the insulating layer 150 may include but not limited to an organic material, an inorganic material, or a combination of the foregoing, for example. In this embodiment, a materials of each of the conductive pad 160 and the test pad 160a may include but not limited to silver, copper, aluminum, molybdenum, tungsten, gold, chromium, nickel, platinum, titanium, iridium, rhodium, indium, bismuth, an alloy of the foregoing, or a metal material exhibiting favorable conductivity, for example. In some embodiments, the materials of the conductive pad 160 and the test pad 160a may be identical or may be different. Fabrication of the insulating layer 150 and the conductive pad 160 is completed so far.

In this embodiment, the insulating layer 150 including the first insulating layer 151 and the second insulating layer 152 is taken as an example. A surface of the first insulating layer 151 adjacent to the substrate 110 may be treated as the second surface 150b of the insulating layer 150, and the second surface 150b of the insulating layer 150 may cover the test circuit component 130, the solder pad 140, and the release layer 120. A surface of the second insulating layer 152 away from the substrate 110 may be treated as the first surface 150a of the insulating layer 150, and the conductive pad 160 is located on the first surface 150a of the insulating layer 150. In addition, the conductive pad 160 is coupled to the connection pad 171 through the second via 172, and the connection pad 171 is coupled to the solder pad 140 through the first via 170, so that the conductive pad 160 is coupled to the solder pad 140. The test pad 160a is coupled to the connection pad 171a through the second via 172a, and the connection pad 171a is coupled to the test circuit component 130 through the first via 170a, so that the test pad 160a is coupled to the test circuit component 130. In addition, the solder pad 140 is coupled to the test circuit component 130, and the test circuit component 130 may extend from the main region 111 to the peripheral region 112 of the substrate 110, so that the conductive pad 160 may be coupled to the test pad 160a through the connection pad 171, the solder pad 140, the test circuit component 130, and the connection pad 171a.

Next, a circuit testing step may be performed to monitor circuit quality of the circuit structure 100, so that an open circuit may be confirmed not to be provided between the conductive pad 160 and the solder pad 140. To be specific, in this embodiment, the conductive pad 160 may be coupled to the test pad 160a through the connection pad 171, the solder pad 140, the test circuit component 130, and the connection pad 171a. As such, probes (not shown) may be disposed on the conductive pad 160 and the test pad 160a, so as to configure the probes to detect a coupling condition between the conductive pad 160 and the test pad 160a through a contact or non-contact manner, so that circuit quality between the conductive pad 160 and the solder pad 140 may thus be obtained.

Figure 2C:
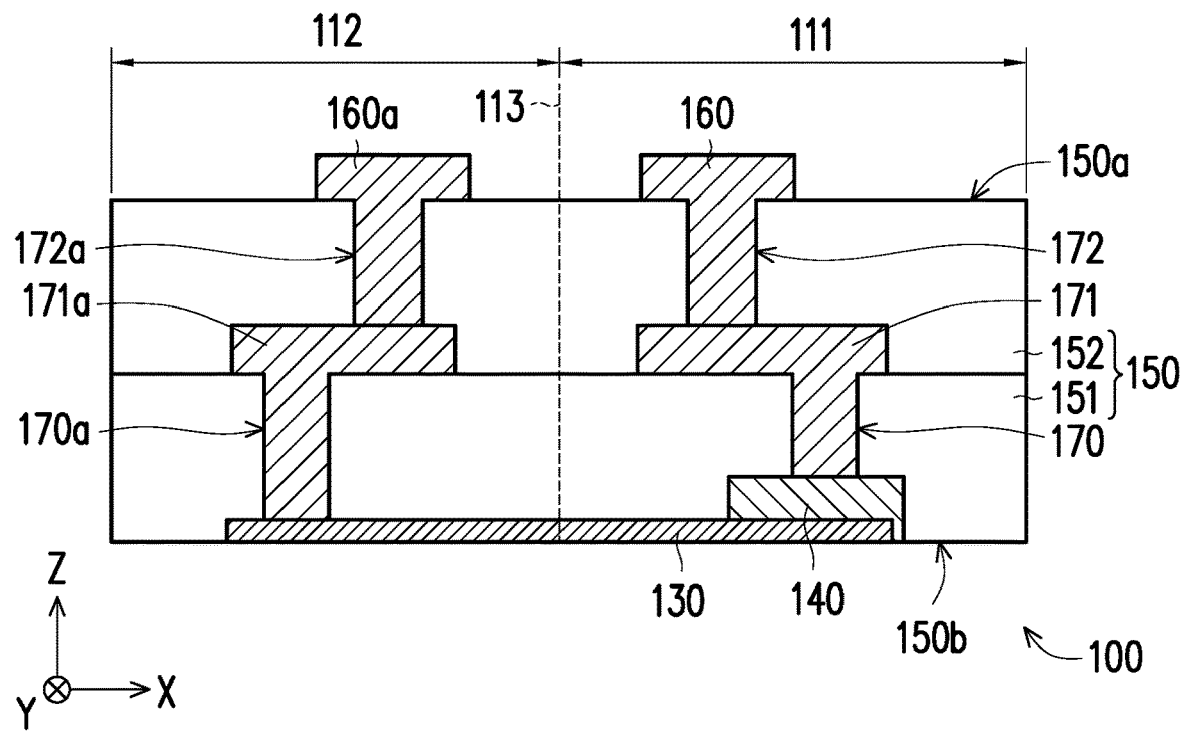

Next, with reference to FIG. 1, FIG. 2B, and FIG. 2C together, step S6 is performed: the substrate 110 is separated. In this embodiment, the release layer 120 and the substrate 110 are removed by but not limited to laser, for example. As such, as shown in FIG. 2C, after the release layer 120 and the substrate 110 are removed through an appropriate manner, the test circuit component 130 and the insulating layer 150 are both configured to be separated from the substrate 110, and the test circuit component 130, part of the solder pad 140, and part of the first insulating layer 151 are exposed.

Afterward, with reference to FIG. 1, FIG. 2C, FIG. 2D, FIG. 2E, and FIG. 4 together, step S7 is performed. In step S7, after the substrate 110 is removed, the test circuit component 130 is removed. To be specific, with reference to FIG. 2C, FIG. 2D, and FIG. 4 first, in this embodiment, after the substrate 110 and the insulating layer 150 are separated and before the test circuit component 130 is removed, cutting is performed first along the cutting line 113 through a wheel cutter or other suitable manners to remove the peripheral region 112 and expose a side surface 150c of the insulating layer 150 and the lateral side 133 of the test circuit component 130. Herein, the side surface 150c of the insulating layer 150 may be substantially flush with the lateral side 133 of the test circuit component 130.

Figure 2D:
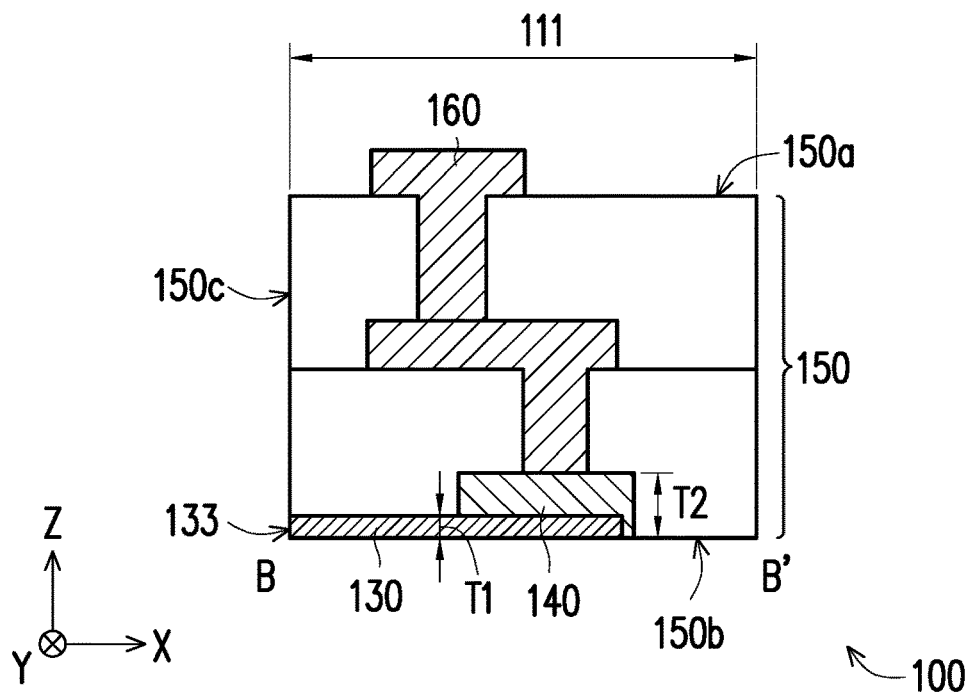
Figure 2E:
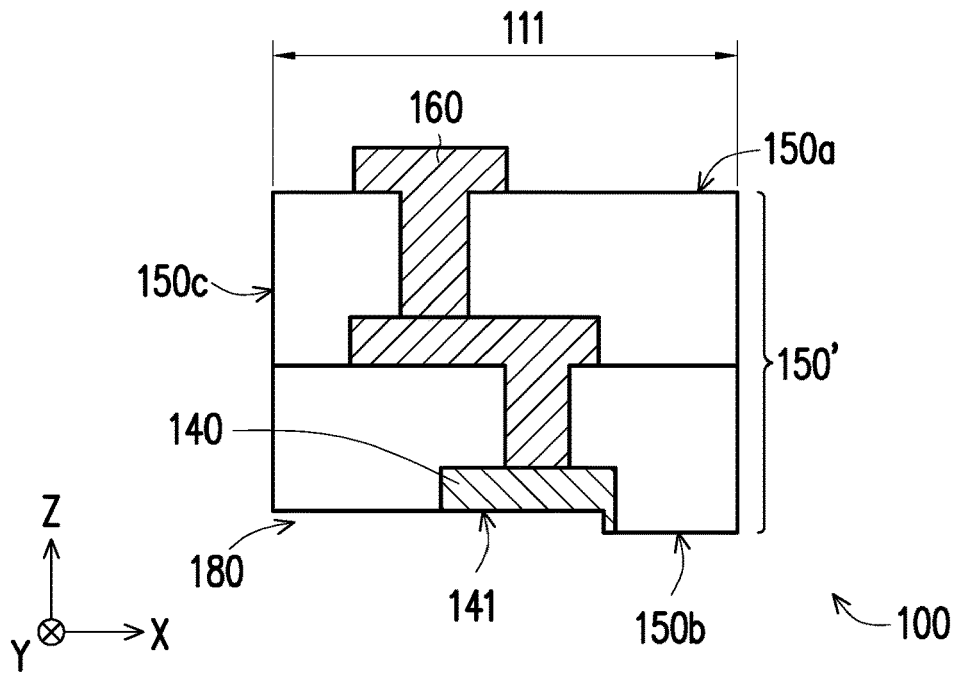

Next, with reference to FIG. 2D and FIG. 2E, after the peripheral region 112 is removed, the test circuit component 130 is removed by, for example, an etching process to expose the second surface 150b of the insulating layer 150 and a lower surface 141 of the solder pad 140.

To be specific, in this embodiment, since the thickness T1 of the test circuit component 130 may be less than the thickness T2 of the solder pad 140, when the test circuit component 130 and the solder pad 140 are made of the same material, the test circuit component is ensured to be completely removed and the solder pad 140 is remained when the etching process is performed. In some embodiments, with reference to FIG. 2E, when the test circuit component 130 and the solder pad 140 are made of different materials, an etching rate of the test circuit component 130 may selectively be greater than an etching rate of the solder pad 140 (that is, an etching rate ratio of the test circuit component 130 to the solder pad 140 is greater than 1), so that when the etching process is performed, the test circuit component 130 is ensured to be completely removed first, and the solder pad 140 is still remained. In addition, with reference to FIG. 2E, after the test circuit component 130 is removed, the second surface 150b of the insulating layer 150 may be configured to include a recess region 180, and the recess region 180 may extend from the solder pad 140 to the side surface 150c of the insulating layer 150. Fabrication of the circuit structure 100 is completed so far.

In short, the circuit structure 100 provided by the present embodiment may include the insulating layer 150, the conductive pad 160, and the solder pad 140. The insulating layer 150 has the first surface 150a and the second surface 150b opposite to the first surface 150a. The conductive pad 160 is disposed on the first surface 150a of the insulating layer 150. The solder pad 140 is adjacent to and disposed on the second surface 150b of the insulating layer 150. The solder pad 140 is coupled to the conductive pad 160. The insulating layer 150 has the recess region 180 on the second surface 150b.

In addition, in following applications, the circuit structure 100 provided by the present embodiment may act as one part of an electronic device. To be specific, through a coupling manner between the conductive pad 160 of the circuit structure 100 and a chip (not shown), the chip may be disposed on the conductive pad 160 of the circuit structure 100. Next, through a coupling manner between the solder pad 140 of the circuit structure 100 and the electronic device (not shown), the solder pad 140 of the circuit structure 100 may be disposed on the electronic device. An electrical connection agent, such as solder, an anisotropic conductive film (ACF), and other suitable materials may be added between the solder pad 140 and the electronic device, which should however not be construed as limitations to the disclosure. Accordingly, in the electronic device including the circuit structure 100, the chip and the electronic device may be electrically connected through the circuit structure 100.

Based on the above, in the circuit structure 100 and the fabrication method thereof provided by the embodiments of the disclosure, the solder pad 140 may be coupled to the test circuit component 130, the conductive pad 160 may be coupled to the solder pad 140, and the conductive pad 160 may be coupled to the test circuit component 130 through the solder pad 140. Therefore, the coupling condition between the conductive pad 160 and the test circuit component 130 (or between the conductive pad 160 and the test pad 160a) may be detected through circuit testing, such that circuit quality between the conductive pad 160 and the solder pad 140 is obtained. Accordingly, reliability of the circuit structure 100 provided by the embodiments of the disclosure may be improved. Further, in the electronic device including the circuit structure 100 provided by the embodiments of the disclosure, fabrication of the circuit structure 100 in which the conductive pad 160 and the solder pad 140 are electrically connected is completed before the chip (not shown) is disposed. Therefore, compared to an existing electronic device in which circuit reliability of the circuit structure is confirmed after the chip is disposed, a chip waste problem caused by unfavorable circuit structure fabrication may be addressed through the fabrication method of the circuit structure provided by the embodiments of the disclosure.

Other embodiments are described for illustration in the following. It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 5:
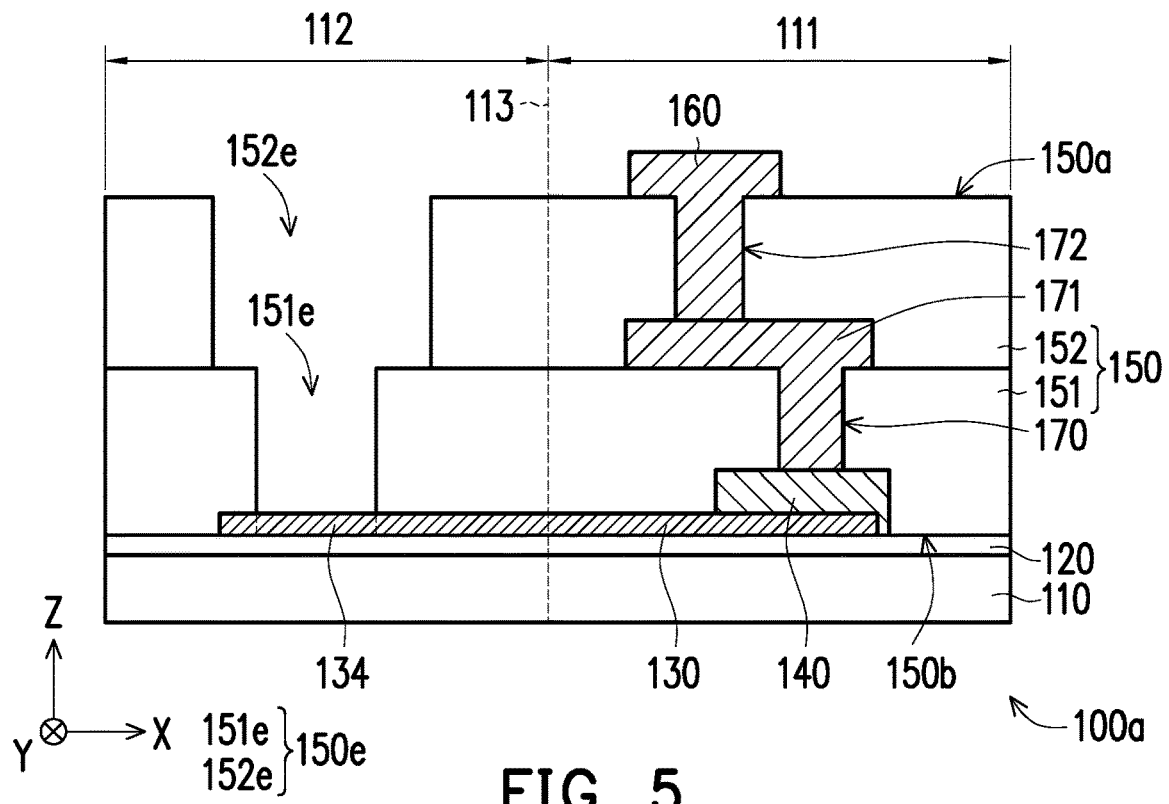
FIG. 5 is a cross-sectional schematic view of a circuit structure before a substrate is removed according to another embodiment of the disclosure.

FIG. 5 is a cross-sectional schematic view of a circuit structure 100a before a substrate is removed according to another embodiment of the disclosure. With reference to FIG. 2B and FIG. 5 together, the circuit structure 100a provided by this embodiment is approximately similar to the circuit structure 100 in FIG. 2B, so that description of identical or similar members in the two embodiments is not repeated. The main difference between the circuit structure 100a of this embodiment and the circuit structure 100 lies in that the insulating layer 150 in the circuit structure 100a of this embodiment has an opening 150e in the peripheral region 112.

To be specific, the opening 150e of the insulating layer 150 may include a first opening 151e of the first insulating layer 151 and a second opening 152e of the second insulating layer 152. The first opening 151e of the first insulating layer 151 is disposed in the peripheral region 112 to expose part of the test circuit component 130 and to act as a connection pad 134. The second opening 152e of the second insulating layer 152 is disposed in the peripheral region 112 to expose the connection pad 134. The first opening 151e of the first insulating layer 151 communicates with the second opening 152e of the second insulating layer 152. A projection of the second opening 152e of the second insulating layer 152 in the direction Z may be but not limited to be greater than a projection of the first opening 151e of the first insulating layer 151.

Besides, a test pad is not provided in the circuit structure 100a provided in this embodiment. As such, when circuit testing is performed to monitor the electrical coupling condition between the conductive pad 160 and the solder pad 140 in the present embodiment, probes (not shown) may be disposed on the conductive pad 160 and the connection pad 134, so as to configure the probes to detect a coupling condition between the conductive pad 160 and the connection pad 134 through a contact manner. In this way, circuit quality between the conductive pad 160 and the solder pad 140 may be obtained, and an open circuit may be confirmed not to be provided between the conductive pad 160 and the solder pad 140.

In view of the foregoing, in the circuit structure and the fabrication method thereof provided by the embodiments of the disclosure, the solder pad may be coupled to the test circuit component, the conductive pad may be coupled to the solder pad, and the conductive pad may be coupled to the test circuit component through the solder pad. Therefore, the coupling condition between the conductive pad and the test circuit component may be detected through circuit testing, such that circuit quality between the conductive pad and the solder pad is obtained. Accordingly, reliability of the circuit structure provided by the embodiments of the disclosure may be improved. Further, in the electronic device including the circuit structure provided by the embodiments of the disclosure, fabrication of the circuit structure in which the conductive pad and the solder pad are electrically connected is completed before the chip is disposed. Therefore, compared to an existing electronic device in which circuit reliability of the circuit structure is confirmed after the chip is disposed, a chip waste problem caused by unfavorable circuit structure fabrication may be addressed through the fabrication method of the circuit structure provided by the embodiments of the disclosure.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:
1. A fabrication method of a circuit structure, comprising:
providing a substrate, wherein the substrate includes a main region and a peripheral region;
fabricating a test circuit component on the substrate, wherein the test circuit component comprises one part corresponding to the main region and the other part corresponding to the peripheral region;
fabricating a solder pad on the test circuit component;
fabricating an insulating layer, wherein a second surface of the insulating layer covers the test circuit component and the solder pad, and the insulating layer comprises one part corresponding to the main region and the other part corresponding to the peripheral region;
fabricating a conductive pad on the insulating layer, wherein the conductive pad is coupled to the solder pad;
fabricating a test pad on the insulating layer, wherein the test pad is coupled to the solder pad;
performing a circuit testing step to confirm an electrical coupling condition between the conductive pad and the solder pad;
separating the substrate;
removing the other part of the test circuit component, the other part of the insulating layer and the test pad after the substrate is separated; and
removing the one part of the test circuit component after performing the circuit testing step and removing the other part of the test circuit component, the other part of the insulating layer and the test pad.

2. The fabrication method of the circuit structure according to claim 1, wherein the conductive pad is located on a first surface of the insulating layer.

3. The fabrication method of the circuit structure according to claim 1, wherein a thickness of the test circuit component is less than a thickness of the solder pad in a normal direction of the substrate.

4. The fabrication method of the circuit structure according to claim 1, wherein the test circuit component and the solder pad are made of different materials.

5. The fabrication method of the circuit structure according to claim 1, wherein the second surface of the insulating layer has a recess region after the test circuit component is removed.

6. The fabrication method of the circuit structure according to claim 1, wherein the test circuit component and the insulating layer are disposed on the main region and the peripheral region, and the solder pad and the conductive pad are disposed on the main region.

7. The fabrication method of the circuit structure according to claim 1, wherein the insulating layer comprises a first insulating layer and a second insulating layer located on the first insulating layer, and the fabrication method of the circuit structure further comprises:

forming a first via in the first insulating layer on the main region;

forming a connection pad on the first insulating layer on the main region;

forming a second via in the second insulating layer on the main region;

forming the conductive pad on the second insulating layer on the main region.

8. The fabrication method of the circuit structure according to claim 7, wherein the conductive pad is coupled to the test circuit component through the connection pad and the solder pad.

9. The fabrication method of the circuit structure according to claim 7, comprising:

forming another first via in the first insulating layer on the peripheral region;

forming another connection pad on the first insulating layer on the peripheral region; and forming another second via in the second insulating layer on the peripheral region.

10. The fabrication method of the circuit structure according to claim 9, wherein the test pad is coupled to the test circuit component through the another connection pad.

11. The fabrication method of the circuit structure according to claim 1, wherein the test pad is coupled to the test circuit component.

12. The fabrication method of the circuit structure according to claim 1, wherein the test pad is coupled to the conductive pad.

13. The fabrication method of the circuit structure according to claim 1, further comprising:

forming a release layer on the substrate such that the test circuit component and the substrate are located on two opposite sides of the release layer.

* * * * *